United States Patent
Faul et al.

(10) Patent No.: US 10,141,229 B2
(45) Date of Patent: Nov. 27, 2018

(54) PROCESS FOR FORMING SEMICONDUCTOR LAYERS OF DIFFERENT THICKNESS IN FDSOI TECHNOLOGIES

(71) Applicant: GLOBALFOUNDRIES Inc., Grand Cayman (KY)

(72) Inventors: Jürgen Faul, Radebeul (DE); Thorsten Kammler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/279,559

(22) Filed: Sep. 29, 2016

(65) Prior Publication Data
US 2018/0090386 A1  Mar. 29, 2018

(51) Int. Cl.
| | |
|---|---|
| H01L 21/8238 | (2006.01) |
| H01L 27/092 | (2006.01) |
| H01L 21/762 | (2006.01) |
| H01L 21/84 | (2006.01) |
| H01L 21/28 | (2006.01) |
| H01L 21/8234 | (2006.01) |

(52) U.S. Cl.
CPC ........... *H01L 21/823807* (2013.01); *H01L 21/28255* (2013.01); *H01L 21/76283* (2013.01); *H01L 21/84* (2013.01); *H01L 27/0922* (2013.01); *H01L 21/823412* (2013.01)

(58) Field of Classification Search
CPC ....... H01L 21/76283; H01L 21/823807; H01L 27/0922
See application file for complete search history.

(56) References Cited

U.S. PATENT DOCUMENTS

| | | | |
|---|---|---|---|
| 2006/0113605 A1* | 6/2006 | Currie | H01L 21/823807 257/368 |
| 2006/0228851 A1* | 10/2006 | Sadaka | H01L 21/84 438/221 |

* cited by examiner

*Primary Examiner* — Robert Bachner
*Assistant Examiner* — Molly Reida
(74) *Attorney, Agent, or Firm* — Amerson Law Firm, PLLC

(57) ABSTRACT

In fully depleted SOI transistors, specifically designed semiconductor materials may be provided for different types of transistors, thereby, for instance, enabling a reduction of hot carrier injection in transistors that are required to be operated at a moderately high operating voltage. To this end, well-controllable epitaxial growth techniques may be applied selectively for one type of transistor, while not unduly affecting the adjustment of material characteristics of a different type of transistor.

18 Claims, 14 Drawing Sheets

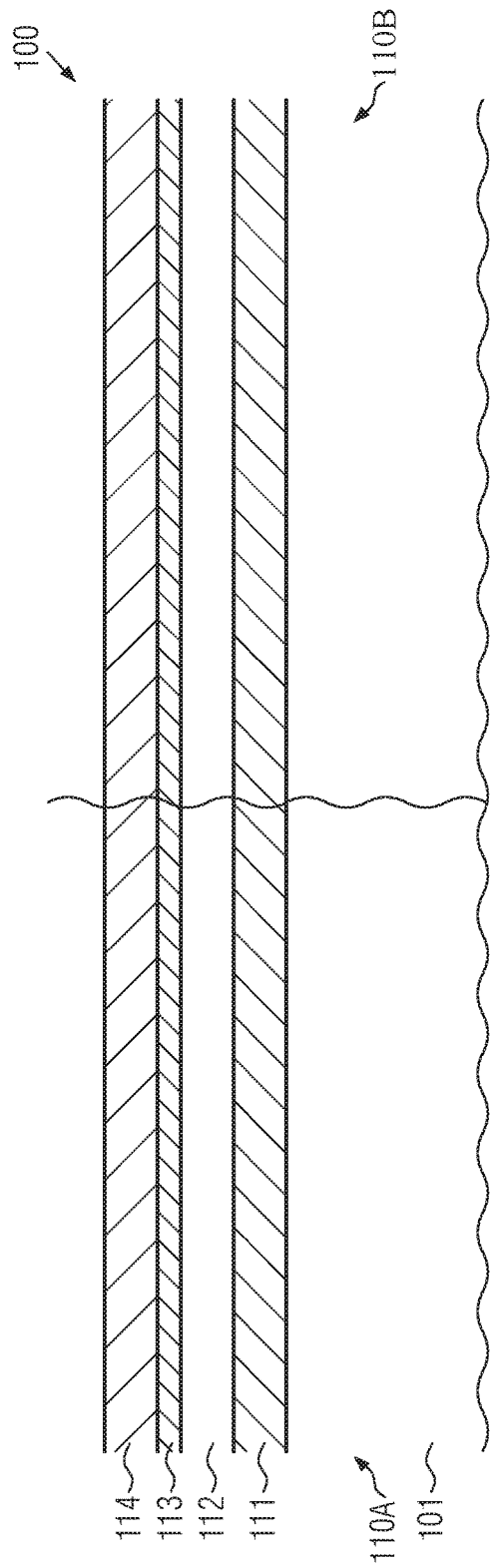
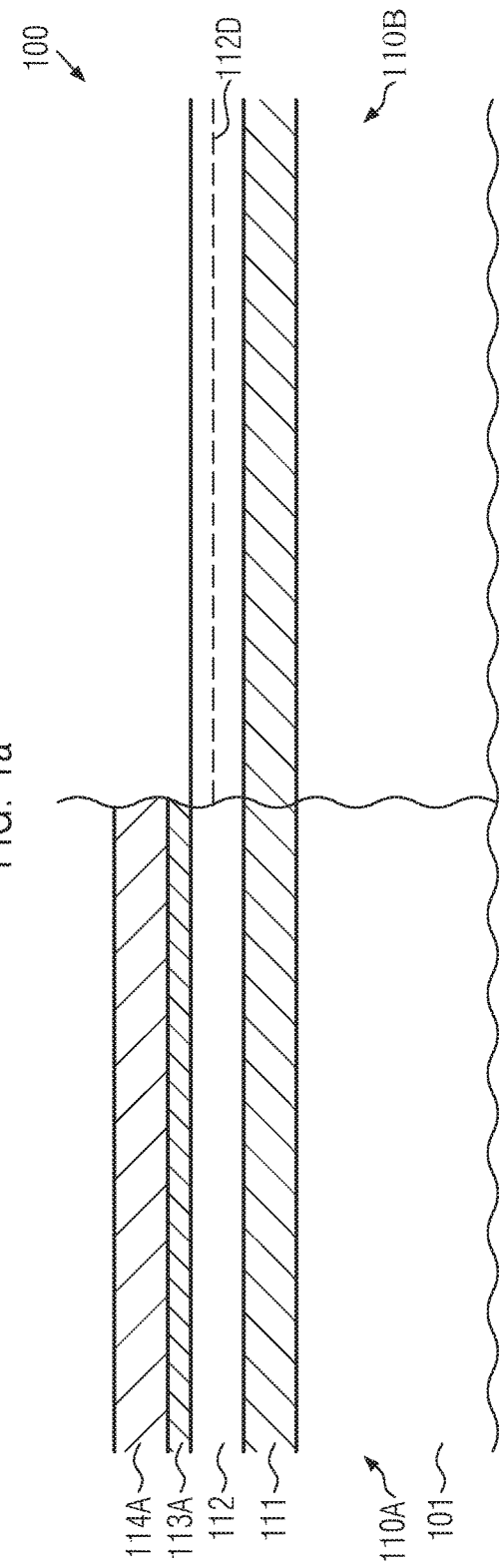

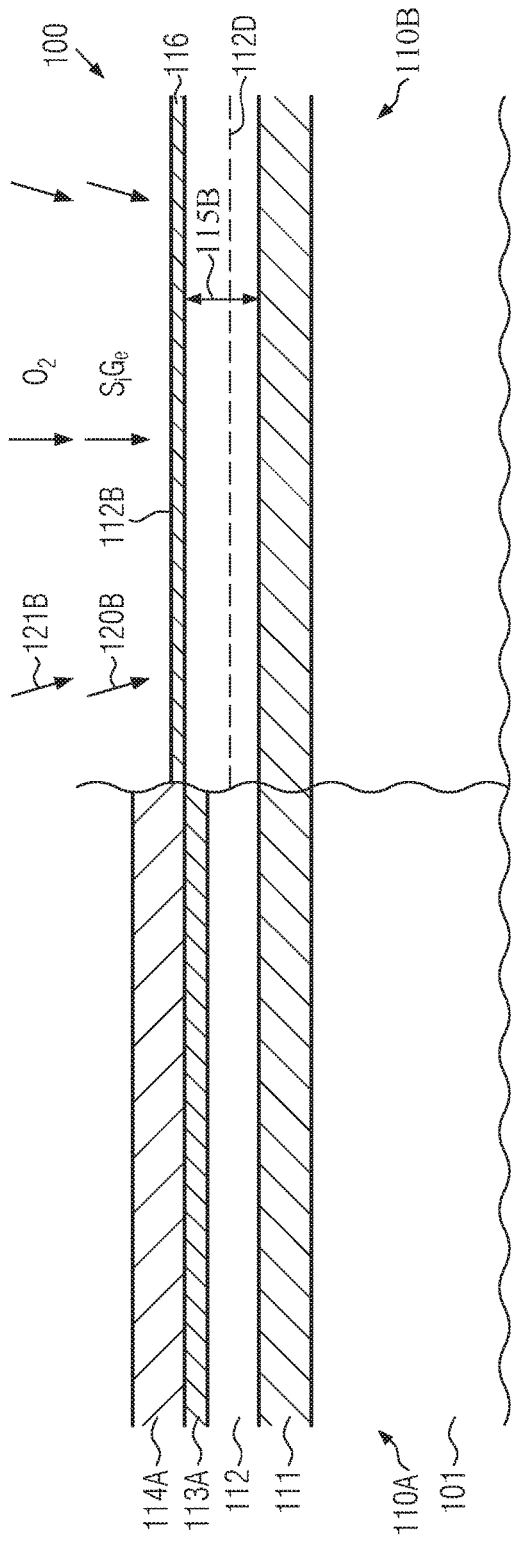
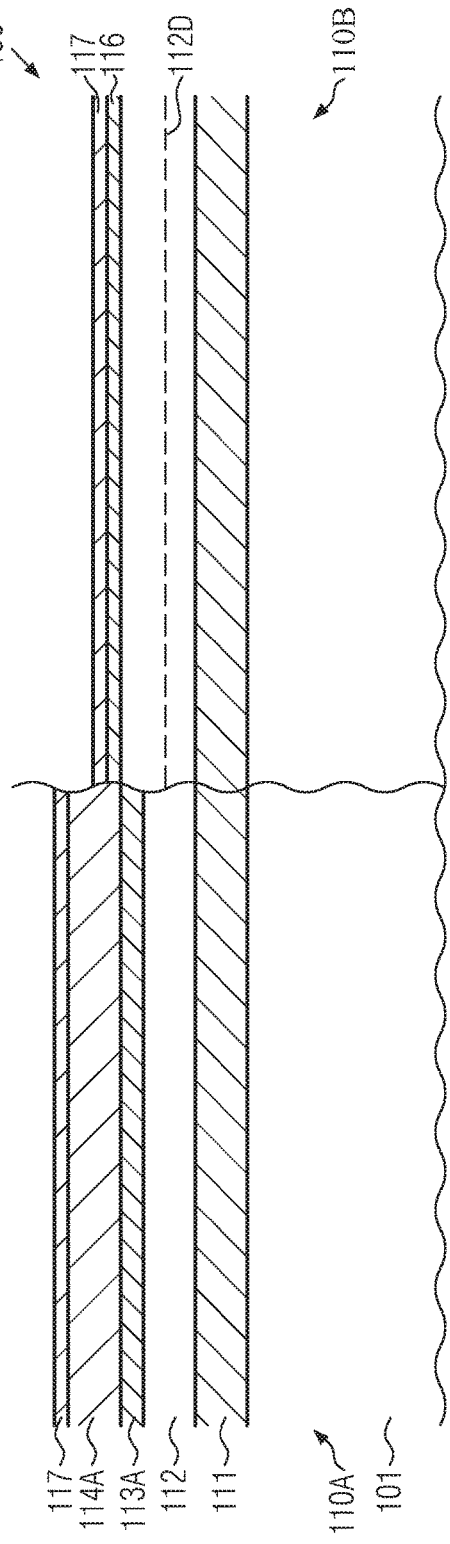

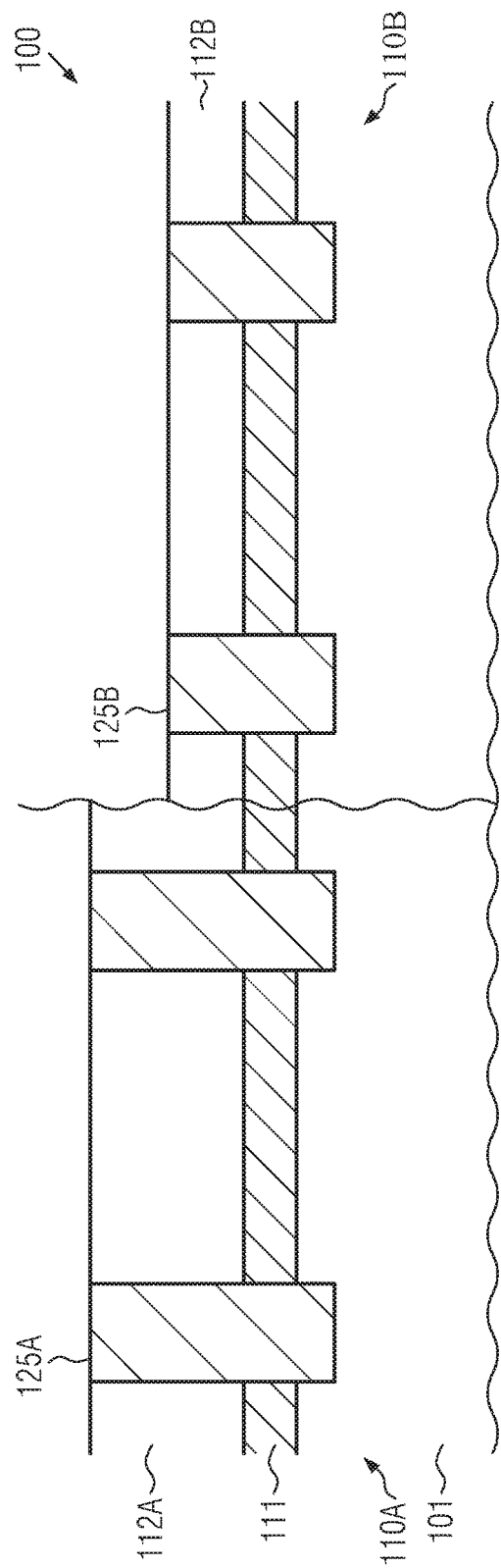

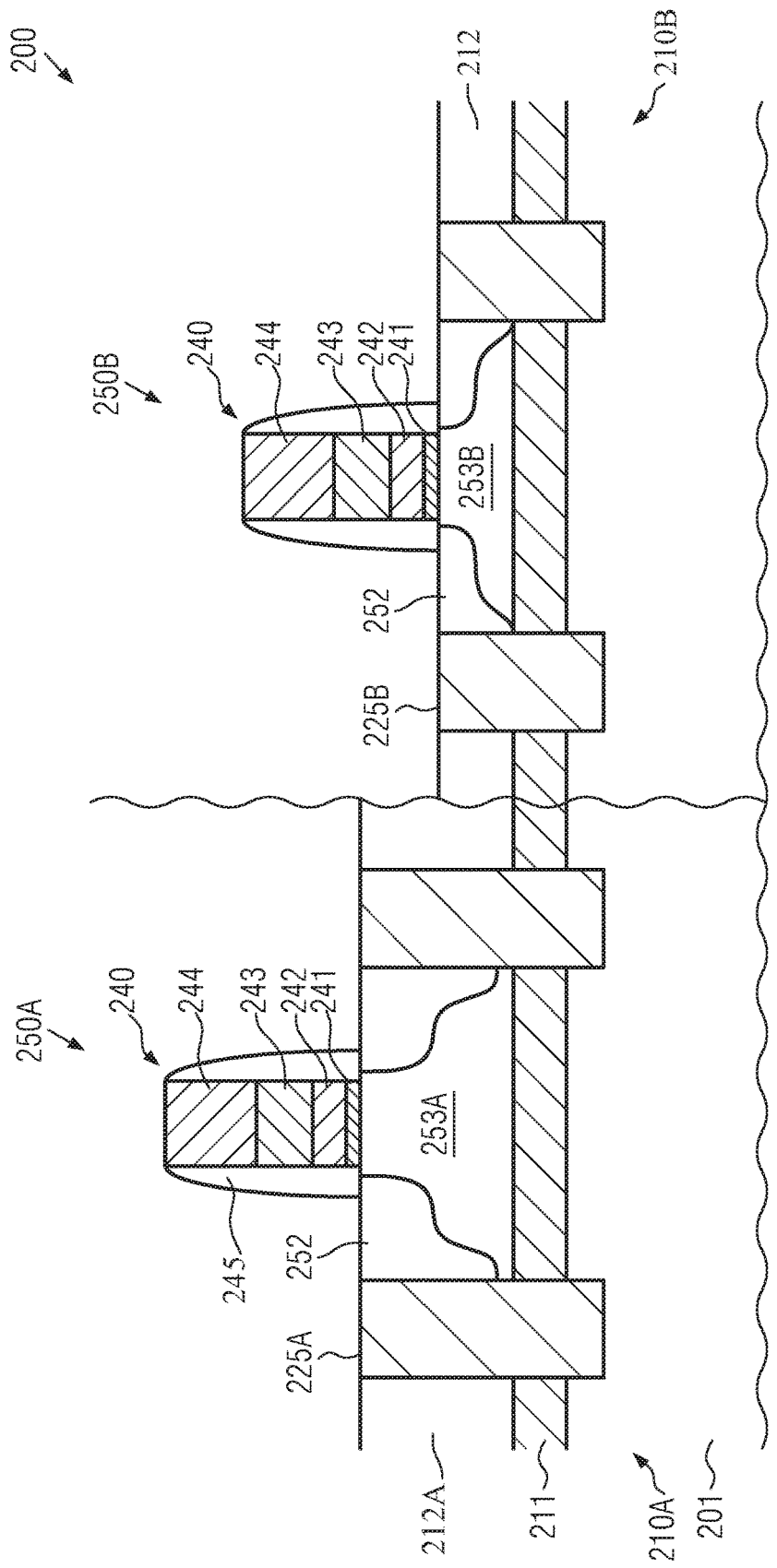

PROCESS FOR FORMING SEMICONDUCTOR LAYERS OF DIFFERENT THICKNESS IN FDSOI TECHNOLOGIES

BACKGROUND

1. Field of the Disclosure

Generally, the present disclosure relates to manufacturing techniques for highly sophisticated integrated circuits including advanced transistor elements based on a fully depleted channel configuration obtained by providing a sufficiently thin semiconductor material in the channel region of the transistor elements.

2. Description of the Related Art

Due to the ongoing demand for electronic devices having superior performance and/or reduced power consumption, integrated circuits, which represent the core of any modern electronic device, have to meet these requirements by steadily reducing the overall dimensions of transistor elements that are the backbone of sophisticated integrated circuits, and of other related circuit elements. In specific fields of fabricating integrated circuits requiring complex entities, such as highly complex logic units, fast and large storage elements and the like, CMOS technology still represents one of the most promising approaches due to superior characteristics in view of manufacturing costs, process complexity and the like compared to other process techniques, which may be available for forming sophisticated control logic and storage devices. Over the past decades, the requirement for increased overall performance and/or reduced power consumption has led to ever decreasing feature sizes of the transistor elements, in recent device generations of 30 nm and less, which, on the one hand, has resulted in higher performance, significantly reduced costs per transistor and the like, and, on the other hand, has continuously confronted process engineers with increasing problems that have to be appropriately addressed in order to enable a further development towards higher integration density and increased overall performance.

For example, upon approaching a channel length of 30 nm and less, well-established process strategies for implementing a channel region that results in both high conductivity and good controllability require, among many other sophisticated developments, extremely complex techniques for appropriately positioning a high concentration of dopants in the channel region. On the other hand, generally, the reduced channel length increases the sensitivity to so-called short channel effects, which basically lead to reduced controllability in establishing a conductive path from the source region to the drain region and in appropriately interrupting the conductive path. That is, the distance between the source region and the drain region has now become so small that the gate electrode may no longer appropriately electrostatically control the channel region. A consequence of the gate electrode's reduced capability of controlling the channel region is an increase in sub-threshold swing, which in turn results in higher leakage currents, when the channel region is actually in the off state. Moreover, the threshold voltage may basically decrease for a shorter channel length, thereby also reducing the margin for proper electrostatic channel control. In short, designing the transistor so as to have a moderately high on current will result in unacceptably high leakage currents in the off state, while, on the other hand, reducing the leakage currents during the off state will involve significantly reduced drive currents.

While a superior electrostatic control of the gate electrode over the channel region may be established by using sophisticated gate electrode structures including high-k dielectric materials in combination with appropriately designed metal-containing electrode materials, a further problem arises with shrinking channel length due to significant fluctuations of the dopant concentration in the channel region, when a channel length of 30 nm and less is to be used. That is, random dopant fluctuations, which appear as unavoidable variations in positioning dopant atoms at the lattice sites of the channel material, may be as high as up to 10% for a low number of dopant atoms in the order of 1000 dopant atoms, thereby resulting in significant device variations from one transistor to another. For millions or billions of transistors provided in a single integrated circuit, these significant fluctuations from transistor to transistor entail unacceptable performance variability across a single integrated circuit device and also across lots or groups of integrated circuits.

In view of these and many other additional problems associated with the shrinkage of critical dimensions, sophisticated device architectures, such as three-dimensional transistors, have been suggested in order to significantly reduce the effects of the above-identified problems. Although the implementation of a three-dimensional transistor architecture into the overall manufacturing process for fabricating complex integrated circuits may be a promising strategy, it appears, however, that extremely complex and thus cost-intensive process techniques have to be applied and many new process strategies have to be newly developed in order to obtain reliable and repeatable production processes for volume production.

On the other hand, it has been proposed to further apply well-established planar transistor architectures based on well-established process techniques, while at the same time a specific design of the channel region is implemented in order to significantly reduce the above-identified short channel effects and dopant-induced device variations. To this end, it has been proposed to adopt a fully depleted channel region substantially without incorporating dopant atoms. That is, the fully depleted state, i.e., the depletion of charge carriers in the channel region without applying a gate voltage, is obtained basically by the geometric structure and the type of semiconductor material in the channel region. For a typical silicon-based semiconductor material, this means that generally a thickness of the silicon layer has to be in the range of approximately 5-25 nm in order to achieve a fully depleted state, which in turn provides superior electrostatic control. On the other hand, due to the missing dopants in the channel region, the transistor characteristics, such as threshold voltage and the like, may have to be adjusted by the type of gate dielectric material used in combination with appropriately selected metal-containing gate electrode materials for providing the appropriate work function in order to adjust the transistor characteristics. Consequently, an extremely thin semiconductor layer, such as a silicon material, may be provided on top of a very thin buried dielectric material, such as a silicon dioxide material, thereby allowing an efficient enclosure of the entire active region of a transistor element, wherein the channel region, i.e., basically that part of the semiconductor material that is positioned below the gate dielectric material, remains substantially undoped. Moreover, a fully depleted SOI (semiconductor-on-insulator) architecture with a very thin buried dielectric material enables that an additional control mechanism for the channel region be implemented by providing a "second" gate electrode below the buried dielectric material, thereby achieving superior overall channel control and also offering a plurality of advantages, such as control of threshold voltage based on a potential applied to the "second" gate electrode, which is also frequently referred to as a back gate.

Although the fully depleted SOI architecture in combination with sophisticated high-k metal gate electrode structures represents a promising strategy for further enhancing overall performance of planar transistor techniques, there are also technical problems involved when actually implementing the above-identified strategy in processes designed for volume production. For example, in complex CMOS integrated circuits, such as microprocessors and the like, the field effect transistors may have to be provided in different "flavors," meaning that, for example, in a processor core, field effect transistors have to be provided with reduced switching times that operate on the basis of a reduced operating voltage of approximately 0.4-1.2 V, thereby requiring a moderately thin gate dielectric material. In other device areas, such as areas requiring memory cells or less time-critical logic areas and the like, an increased operating voltage of 1.2-3.3 V is often used in combination with a gate dielectric material of increased thickness so as to significantly reduce off-state gate leakage and the like.

Consequently, different device regions are implemented and processed so as to obtain a gate dielectric material that is adapted to the specific requirements of the various transistor elements provided in the different device regions, which, however, may be accompanied by reduced transistor reliability and stability, in particular for devices having a moderately thick gate dielectric material. It has been observed that field effect transistors formed on the basis of a relatively thin silicon material having a thickness of approximately 6 nm for establishing the fully depleted transistor architecture may suffer from increased hot carrier injection degradation. That is, in hot carrier injection, a charge carrier may gain sufficient kinetic energy when moving from the source region towards the drain region so as to overcome the barrier to the gate dielectric material, thereby resulting in the incorporation of the charge carrier in the gate dielectric material. Upon accumulation of such captured charge carriers, the transistor characteristics may significantly change over time, for instance with respect to threshold voltage and the like. Since some of the transistor elements may have to be operated at elevated operating voltages, as discussed above, the electric field at the vicinity of the gate electrode/drain region may become extremely high so as to promote the carrier injection into the gate dielectric material. It has been recognized that a moderate increase of the thickness of the silicon material forming the channel region of a fully depleted SOI transistor may efficiently reduce the probability for charge carrier injection into the gate dielectric material, while still substantially maintaining a fully depleted device configuration. It appears, however, that an increase of thickness of the semiconductor material in the channel regions of the transistors may entail a significant performance degradation of the transistor elements that have a moderately thin gate dielectric material and that are operated at a reduced operating voltage.

In view of the situation described above, the present disclosure relates to techniques in which a fully depleted transistor configuration may be obtained for different types of transistor elements while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides manufacturing techniques in which a semiconductor material for forming one type of transistor element that requires a moderately high operating voltage may be provided on the basis of an epitaxial growth process in order to obtain a desired basic thickness of the semiconductor material without affecting the required thickness of the semiconductor material used for the fabrication of one or more other types of transistor elements, such as transistors operated at a moderately low operating voltage. Consequently, semiconductor-based materials with appropriate thickness for two or more different types of transistors may be provided substantially without mutual influence, wherein at least the thickness of the semiconductor material of transistor elements operated on the basis of a moderately high operating voltage is formed on the basis of an epitaxial growth process, thereby providing superior process control and overall repeatability so that variations of transistor characteristics may remain low.

One illustrative method disclosed herein relates to the formation of semiconductor devices. The method includes epitaxially growing a portion of a first semiconductor layer above a buried insulating layer in a first device region, wherein the first semiconductor layer has a first thickness after the epitaxial growth process is performed. The method further includes forming a second semiconductor layer of a second thickness above the buried insulating layer in a second device region, wherein the second thickness differs from the first thickness. Moreover, a first transistor element is formed in and on the first semiconductor layer and a second transistor element is formed in and on the second semiconductor layer, wherein the second transistor element comprises a fully depleted channel region.

A further illustrative method disclosed herein relates to the formation of semiconductor devices. The method includes providing an initial semiconductor layer above a first device region and a second device region, wherein the initial semiconductor layer is formed above a buried insulating layer. Moreover, the method includes performing a first epitaxial growth process selectively in the first device region so as to form a first semiconductor layer by using at least a first portion of the initial semiconductor layer as a growth template. The method further includes, prior to the first epitaxial growth process, performing a second epitaxial growth process in the second device region so as to form a second semiconductor layer by using at least a second portion of the initial semiconductor layer as a growth template. Additionally, the method includes forming a first transistor element in and on the first semiconductor layer and forming a second transistor element in and on the second semiconductor layer, wherein the second transistor element comprises a fully depleted channel region.

A still further illustrative method disclosed herein relates to the formation of semiconductor devices. The method includes providing an initial semiconductor layer above a first device region and a second device region, wherein the initial semiconductor layer is formed above a buried insulating layer. Moreover, a first epitaxial growth process is selectively performed in the first device region so as to form a first semiconductor layer. The method further includes, after the first epitaxial growth process, performing a second epitaxial growth process in the second device region so as to form a second semiconductor layer. Additionally, the method includes forming a first transistor element in and on the first semiconductor layer and forming a second transistor element in and on the second semiconductor layer, wherein the second transistor element comprises a fully depleted channel region.

BRIEF DESCRIPTION OF THE DRAWINGS

The disclosure may be understood by reference to the following description taken in conjunction with the accompanying drawings, in which like reference numerals identify like elements, and in which:

FIGS. 1a-1j schematically illustrate cross-sectional views of a semiconductor device during various stages in forming semiconductor layers of different thickness by epitaxial growth for a fully depleted transistor architecture according to illustrative embodiments;

FIGS. 2a-2e schematically illustrate cross-sectional views of a semiconductor device during various manufacturing stages in forming semiconductor devices with fully depleted transistor architectures on the basis of an epitaxial growth process according to further illustrative embodiments.

Figure 1E:
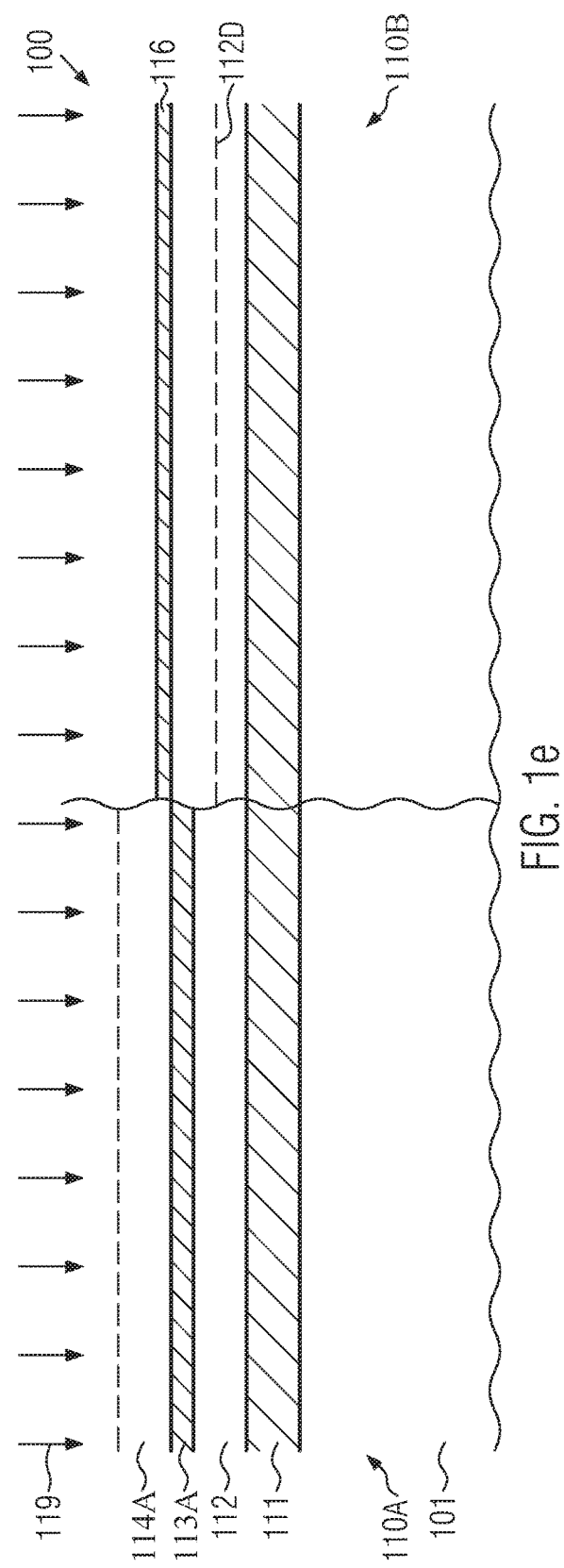

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In illustrative embodiments, the present disclosure relates to process techniques for providing a semiconductor layer or a semiconductor-based material for forming transistor elements in accordance with a sophisticated fully depleted SOI architecture, wherein transistor elements that are required to be operated at low operating voltages may receive a semiconductor layer or a semiconductor-based material in such a manner that an increased thickness of the semiconductor layer will result in a significantly reduced electric field, in particular at the transistor gate edge/drain region, thereby also significantly reducing the probability for hot carrier injection.

To this end, at least the moderately thick semiconductor layer of the transistors to be operated at elevated operating voltages may be formed on the basis of an epitaxial growth process, which per se ensures superior process controllability and thus reduced overall transistor variability compared to, for instance, a thickness adaptation by material removal, for instance, by oxidation and subsequent removal of oxidized material portions. The process steps for obtaining at least two different types of semiconductor material with respect to thickness may be implemented into the overall process flow so as to obtain, in total, a very efficient process flow without unduly affecting other processes or even providing superior process efficiency and/or device characteristics, for instance, in terms of superior interface characteristics of a gate dielectric material and the like. In illustrative strategies disclosed herein, a semiconductor material of increased thickness may be provided in an early manufacturing stage, for instance, prior to defining or conditioning a semiconductor material for device regions in which transistor elements to be operated at a low operating voltage have to be implemented. In this manner, the additional process steps for providing one or more semiconductor materials with increased thickness may be efficiently integrated in the overall process flow without unduly affecting subsequent process steps and without unduly increasing overall process complexity.

In other illustrative embodiments disclosed herein, the epitaxial growth process for forming a semiconductor layer of increased thickness may be performed after preparing/conditioning the semiconductor layer or base material for transistor elements requiring a very thin channel region so as to obtain the required performance and transistor characteristics. In this strategy, a plurality of options may be available so as to improve overall transistor characteristics, such as interface quality of a gate dielectric material, without unduly adding to overall process complexity.

With reference to FIGS. 1a-1k and 2a-2e, further illustrative embodiments will now be described in more detail.

FIG. 1a schematically illustrates a cross-sectional view of a semiconductor device 100 in an early manufacturing stage. As illustrated, the device 100 comprises a substrate 101, which may represent any appropriate semiconductor material, such as silicon and the like, and which may act as an appropriate carrier material for forming thereon a buried insulating layer 111, such as an oxide layer, a nitride layer or any mixture thereof. It should be appreciated that the substrate 101 may be provided in the form of different semiconductor materials, if, for instance, appropriate electronic characteristics have to be established in at least some regions of the material 101, for instance, for providing a back gate structure, as discussed above, and the like. Although silicon material is frequently used in the semiconductor industry, other semiconductor materials may also be used for the substrate 101. As already discussed above, the buried insulating layer 111, for instance provided in the form of a silicon dioxide material and the like, may have an appropriate thickness, for instance, in the range of 5-50 nm, in order to comply with the requirements of a fully depleted SOI configuration.

An initial semiconductor layer 112 may be formed on the buried insulating layer 111 and may have a thickness that is appropriate for the further processing of the device 100. For example, the initial semiconductor layer 112 may be provided in the form of a silicon material having any desired crystallographic orientation. Although silicon is frequently used as a base material for forming sophisticated semiconductor devices, the layer 112 may be provided in the form of other materials, such as silicon/germanium, silicon/carbon, germanium, III/V semiconductor material and the like. The thickness of the layer 112 may be in the range of approximately 3-10 or more nm, which may typically allow the fabrication of fully depleted transistor elements substantially without modifying the thickness of the layer 112. As will be explained later on, according to the present disclosure, at least the thickness of the initial semiconductor layer 112 may be modified at least in a first device region 110A so as to obtain an increased thickness of, for example, in the range of approximately 8-15 nm. On the other hand, the thickness and/or the material characteristics of the semiconductor layer 112 may also be modified in a second device region 110B so as to comply with the requirements for sophisticated high-performance transistor elements to be formed in and on the semiconductor layer 112 after its modification. Moreover, in the manufacturing stage shown, a first dielectric layer 113, such as an oxide layer, with a thickness of several nanometers may be formed on the semiconductor layer 112, followed by a hard mask layer 114, which may be provided in the form of a silicon nitride material and the like. For example, a thickness of the layer 114 may range from approximately 5-10 nm.

The semiconductor device 100 as shown in FIG. 1a may be formed on the basis of the following process techniques. The substrate 101 may be obtained from a specific manufacturer of SOI (semiconductor-on-insulator) substrates having formed therein very thin buried insulating layers, and/or a base SOI substrate may be further processed or may be formed on the basis of appropriate process techniques, for instance, by implanting an oxidizing species and heat treating the substrate 101 or by sophisticated wafer cut and bond techniques and the like. Thereafter, the oxide layer 113 may be formed, for instance, by thermal oxidation and the like, wherein a desired thickness of the layer 113 and also a desired degree of material consumption of the layer 112 may be adjusted according to process and device requirements. To this end, well-established oxidation recipes are available in order to obtain a desired thickness and/or adjust a thickness of the layer 112. Thereafter, the hard mask layer 114 may be formed, for instance, by well-established deposition techniques, such as chemical vapor deposition (CVD) and the like.

FIG. 1b schematically illustrates the semiconductor device 100 in a further advanced manufacturing stage. As illustrated, the hard mask layer 114 and the layer 113 have been patterned so as to expose the initial semiconductor layer 112 above the second device region 110B, thereby providing a growth mask in the form of the remaining portion of the hard mask layer, now indicated as mask layer 114A. Similarly, the remaining portion of the layer 113 is now referred to as layer 113A. The patterning of these dielectric materials may be accomplished on the basis of well-established process techniques, including a lithography process followed by an etch process, such as a reactive ion etch process, possibly in combination with additional process steps as may be required for substantially exposing the surface of the semiconductor layer 112. In the embodiment illustrated with reference to FIGS. 1a-1k, the initial semiconductor material in the second device region 110B is to be modified in order to obtain the desired material characteristics, for instance, with respect to charge carrier mobility and the like, thereby providing the necessary prerequisites for forming sophisticated high performance transistor elements.

In illustrative embodiments, the exposed portion of the semiconductor layer 112 may be prepared for receiving thereon or therein a silicon/germanium material, which exhibits superior charge carrier mobility compared to a substantially pure silicon material. It should be appreciated, however, that, in other illustrative embodiments, any other type of semiconductor material may be formed so as to replace or supplement at least a portion of the exposed part of the semiconductor layer 112 above the second device region 110B. For example, a silicon/carbon mixture, a more or less pure germanium material or III/V semiconductor compounds may be formed in the second device region 110B. Since, in illustrative embodiments, the formation of a desired semiconductor species may be accomplished on the basis of epitaxial growth techniques, the exposed portion of the semiconductor layer 112 may be subjected to a corresponding treatment for removing contaminants, such as native oxide and the like, and also for preparing the surface to the following selective epitaxial growth process. To this end, well-established cleaning recipes are available that provide the required surface characteristics. It should be appreciated that, during any such processes for adjusting the overall conditions for the subsequent deposition of a desired semiconductor material, a part of the exposed portion of the semiconductor layer 112 may be removed, as indicated by 112D, in order that, after the epitaxial growth process and possibly after any further additional process steps, a desired total thickness of the resulting semiconductor material is achieved. As a consequence, the desired final thickness and material composition in the second device region 110B may be adjusted without affecting the first device region 110A, which is covered at least by one of the layers 113A and 114A.

FIG. 1c schematically illustrates the semiconductor device 100 during a process sequence for forming a desired semiconductor material in and on the initial semiconductor layer 112, wherein the finally obtained semiconductor material is now referred to as material 112B. To this end, in one illustrative embodiment, a selective epitaxial growth process 120B may be applied, in which appropriate precursor gases are provided and an appropriate deposition atmosphere may be established so as to substantially selectively deposit a silicon/germanium material with a specified fraction of germanium on the exposed portion of the semiconductor layer 112, which thus acts as a growth template. After the growth of the semiconductor material 112B, a further process 121B may be performed, during which a "condensation" of germanium may be achieved, for instance, by performing a heat treatment in an oxidizing ambient, thereby forming an oxide material 116, which mainly consists of silicon dioxide, while the germanium atoms are preferably driven into deeper areas of the semiconductor material 112B, thereby increasing the overall germanium concentration in the material 112B. Consequently, a significantly higher germanium concentration may be obtained by applying the condensation process 121B compared to the situation after the selective epitaxial growth process 120B. As a consequence, depending on the process parameters and the initially deposited thickness of the silicon/germanium material, a final thickness 115B is obtained so as to comply with the requirements for sophisticated transistor elements to be formed on the basis of the semiconductor material 112B. For example, the thickness 115B may range from 4-8 nm, which may allow the application of fully depleted transistor elements having a moderately thin gate dielectric material for operation of any such transistors with a relatively low operating voltage, as discussed above. The oxide layer 116 may have a thickness of 10-20 nm after the condensation process 121B. It should be appreciated that, in other illustrative embodiments, as will be discussed later on, the oxide layer 116 may act as a hard mask or growth mask and, hence, the thickness thereof may be controlled such that its initial thickness is compatible with the further processing. To this end, the process parameters of the selective epitaxial growth process 120B and, in particular, the parameters of the subsequent condensation process 121B may be appropriately controlled so as to obtain the required thickness for the layer 116.

FIG. 1d schematically illustrates the semiconductor device 100 in a manufacturing stage in which, according to illustrative embodiments, an additional hard mask layer 117 may be formed above the entire surface in order to protect the second device region 110B in a subsequent process sequence for forming the semiconductor material above the first device region 110A with a desired target thickness. The hard mask layer 117 may be deposited on the basis of well-established deposition techniques, such as chemical vapor deposition, using precursor materials for forming a silicon nitride material and the like. For example, the layer 117 may be formed with a thickness of 3-10 nm.

FIG. 1e schematically illustrates the semiconductor device 100 according to a further illustrative embodiment. As already discussed above, the oxide layer 116 may have been formed so as to comply with the requirements during the following process steps for forming an appropriate semiconductor material above the first device region 110A. To this end, an appropriate selective etch process 119 may be applied, which is appropriately designed so as to selectively remove the layer 114A from above the first device region 110A. For example, well-established selective etch recipes are available for removing silicon nitride material, while substantially not unduly affecting a silicon dioxide material. Consequently, the previously formed oxide layer 116 may act as an etch mask, while the layer 113A above the first device region 110A may serve as an etch stop layer. It should be appreciated that the layers 113A and 116 may initially be formed so as to have the desired material characteristics, i.e., in particular an appropriate thickness, so as to comply with the requirements for the further processing. That is, the material removal in the next process steps may be taken into consideration upon adjusting an initial layer thickness so that, in particular, the layer 116 may be used as a growth mask in a selective epitaxial growth process for forming the semiconductor layer above the first device region 110A with a desired increased thickness. As discussed above, an increased thickness may result in the advantageous effect of a reduced electric field in the vicinity of the drain areas of sophisticated transistors to be formed on the basis of the semiconductor material in the first device region 110A, thereby allowing these transistors to be operated on the basis of elevated operating voltages, as discussed above.

Figure 1F:
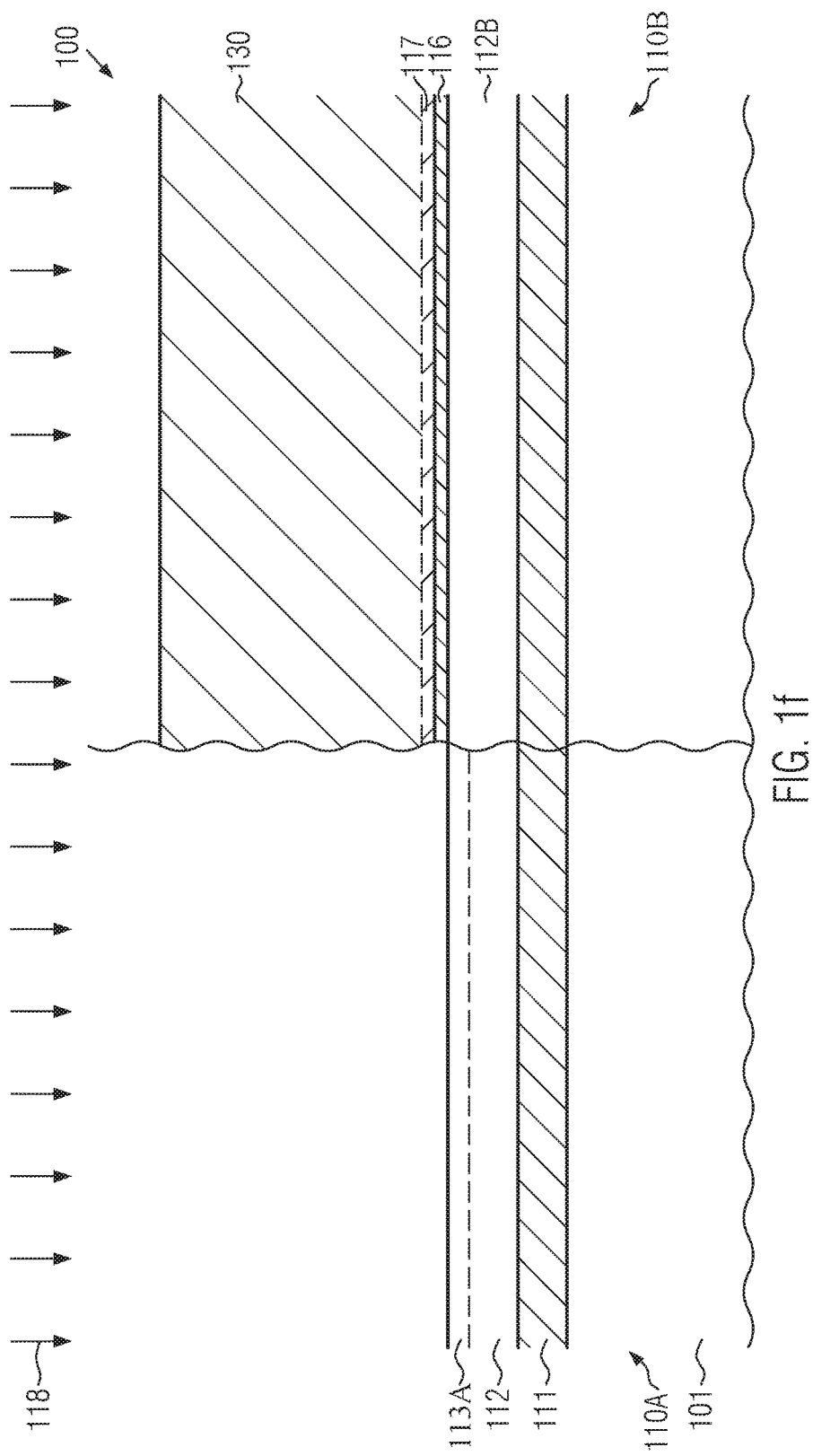

FIG. 1f illustrates the semiconductor device 100 during a patterning process 118, in which the semiconductor layer 112 above the first device region 110A may be exposed. For example, a lithography process and the corresponding mask 130 may be formed so as to cover the second device region 110B and an etch process or a sequence of etch processes may be applied so as to remove the layer 117, if provided in earlier stages of the manufacturing process, and to remove at least the layer 113A, possibly in combination with the layer 114 (see FIG. 1e) so as to finally expose or substantially expose the surface of the semiconductor layer 112. It should be appreciated that, during the patterning process 118, a certain amount of material of the semiconductor layer 112 may also be removed, if considered appropriate for the further processing, for instance, for removing surface contaminants and the like. Furthermore, an appropriate surface preparation may be applied that is directed to condition the surface of the layer 112 for a subsequent epitaxial growth process, in which a desired semiconductor material is to be deposited.

Figure 1G:
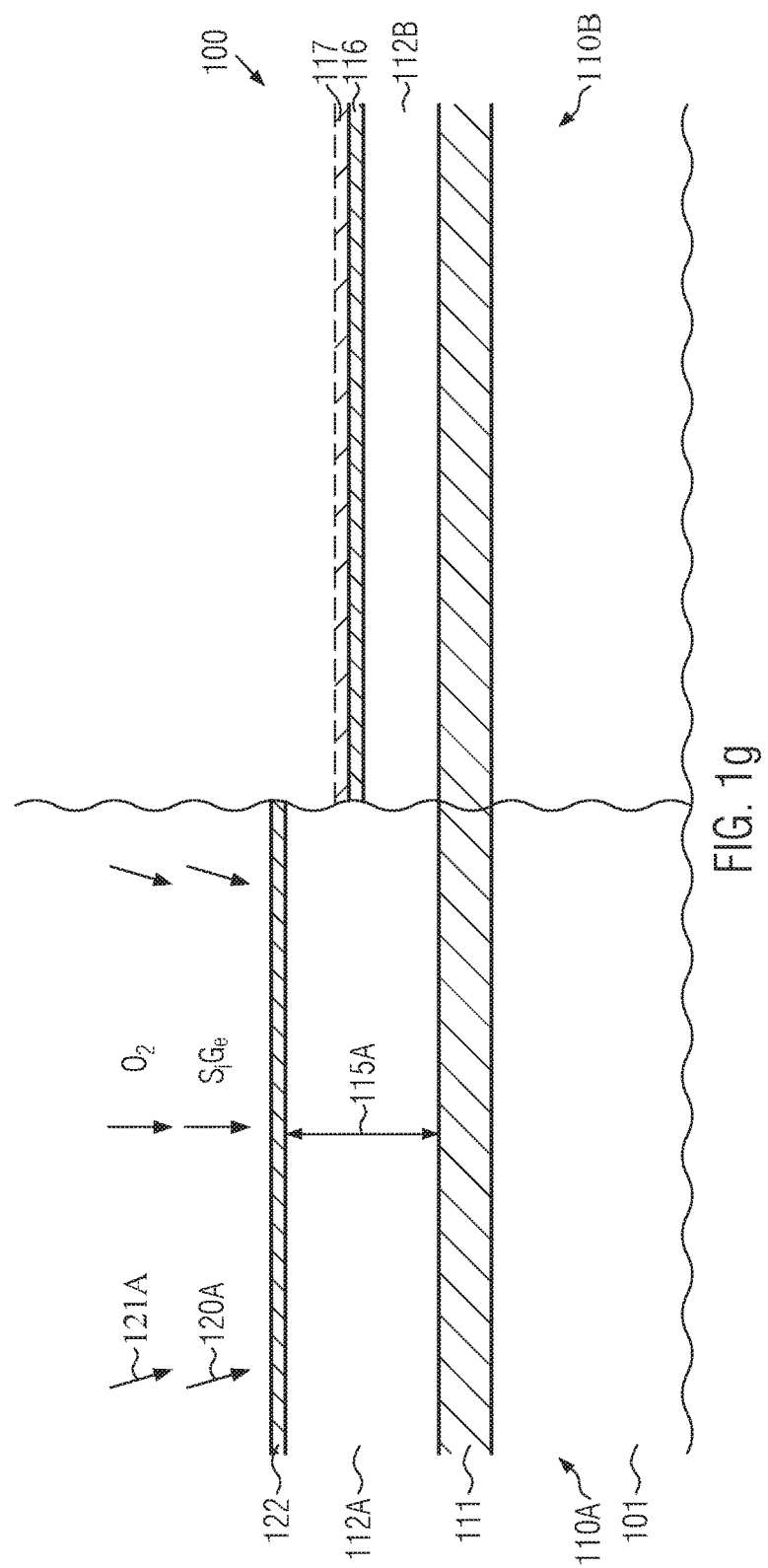

FIG. 1g schematically illustrates the device 100 in a further advanced manufacturing stage. As illustrated, a selective epitaxial growth process 120A may be performed so as to deposit a desired semiconductor material, such as silicon, thereby forming a semiconductor layer 112A with increased thickness compared to the thickness of the initial semiconductor layer 112 (see FIG. 1a). As discussed above, it should be appreciated that, during the selective epitaxial growth process 120A, other semiconductor materials may be deposited, such as silicon/germanium, silicon/carbon, germanium, III/V semiconductor compounds and the like, as is considered appropriate for the formation of respective transistor elements. Thereafter, a further process may be performed so as to form a protective layer, such as an oxide layer, 122, which may be accomplished by wet chemical treatment, thermal oxidation and/or radical oxidation. To this end, a process or process sequence 121A may be applied, preferably without intermittently exposing the device 100 to a non-controlled process ambient after the selective epitaxial growth process 120A. Depending on the overall process strategy for forming the protective layer 122, a target thickness 115A of the semiconductor layer 112A may be obtained, for example, in the range of 8-15 nm. For example, upon forming the semiconductor layer 112A, any material consumption during the process 121A may readily be taken into consideration so as to achieve the desired thickness 115A. It should be appreciated that, during the selective epitaxial growth process 120A, the hard mask layer 117, such as a silicon nitride material, may act as a growth mask, if provided in earlier manufacturing stages, while, in other cases, the layer 116, which may have been reduced in thickness due to the preceding surface preparation processes preceding the selective epitaxial growth process 120A, but may still act as a growth mask. In this case, the subsequent oxidation process for forming the layer 122 may also influence the layer 116 and possibly the semiconductor material 112B, wherein any such potential material consumption of the semiconductor layer 112B may readily be taken into consideration upon forming the layer 112B with the target thickness 115B (see FIG. 1c).

Figure 1H:
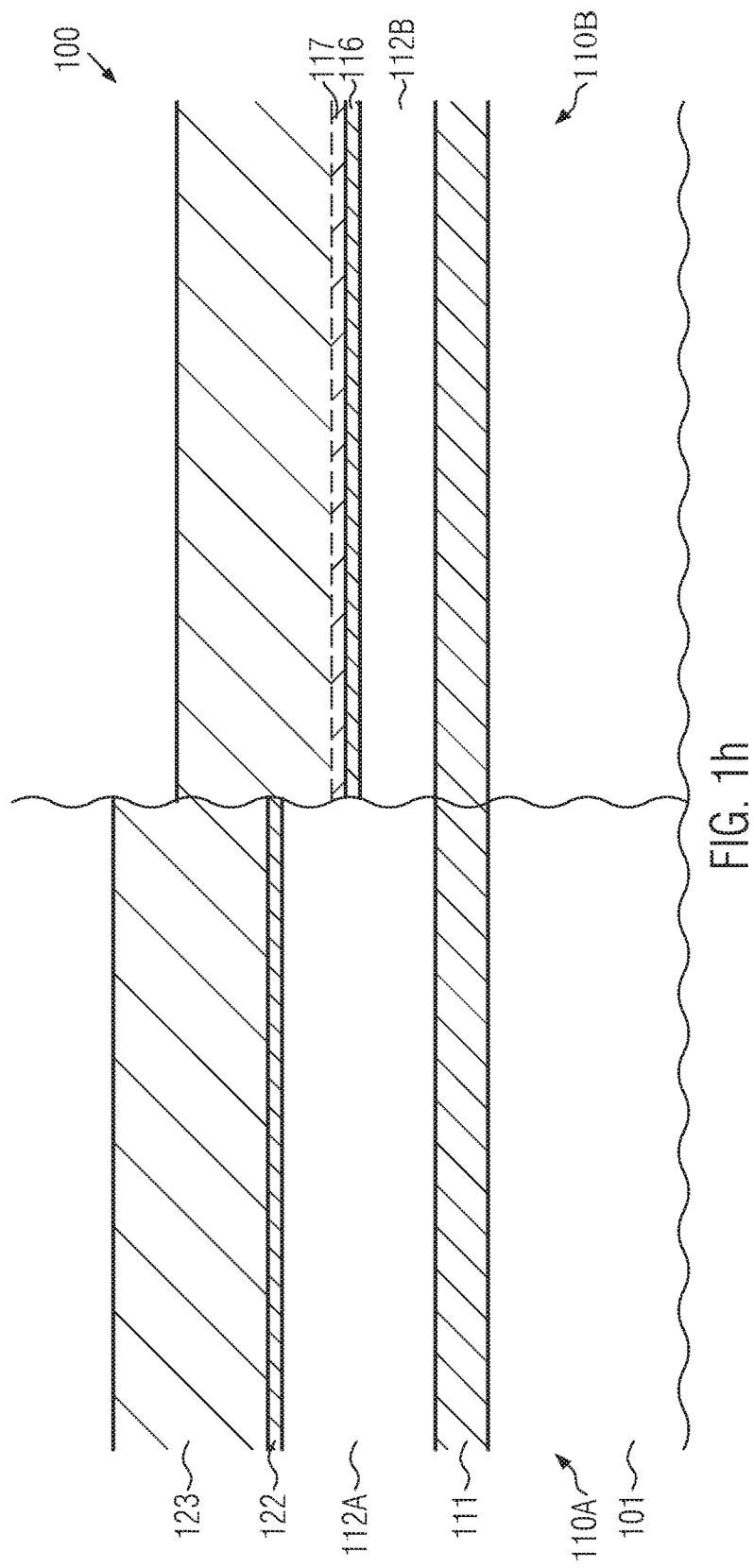

FIG. 1h schematically illustrates the semiconductor device 100 in a stage in which a mask layer 123, such as a silicon nitride mask having an appropriate thickness of approximately 40-70 nm, is formed above the entire substrate 101. Appropriate deposition techniques are well established in the art and may readily be applied for forming the mask layer 123. It should be appreciated that the surface topography caused by the semiconductor materials 112A, 112B may substantially not negatively influence the further processing, since a corresponding height difference may range from approximately 3-10 nm, depending on the respective thickness values required for the first and second device regions 110A, 110B.

It should further be appreciated that providing two different device regions above the substrate 101 is merely one illustrative possibility, and more than two different device regions, such as three, four and more different device regions, may be provided, wherein an analogous process sequence may be performed that provides an appropriate semiconductor material having desired characteristics with respect to material composition and/or thickness for various types of transistor elements. In this case, it is to be taken into consideration that one or more of some of the hard mask layers, which may act as a growth mask, may have to be used repeatedly as a growth mask, thereby suffering from increased material consumption, which, however, may readily be taken into consideration upon initially forming these hard mask materials.

FIG. 1*i* schematically illustrates the semiconductor device 100 in a further advanced manufacturing stage. As shown, trench isolation structures 125A may be formed in and above the first device region 110A in order to define "active" regions in the semiconductor layer 112A, wherein the respective active regions are appropriately dimensioned for forming transistor elements, such as P-channel transistors and N-channel transistors, depending on the overall device requirements. Similarly, trench isolation structures 125B may be formed in and above the second device region 110B, thereby defining a plurality of active regions in the semiconductor material 112B in accordance with overall device requirements. It should be appreciated that the trench isolation structures 125A, 125B may extend through the buried insulating layer 111, thereby also providing for the possibility of forming appropriately doped areas for additionally controlling a channel region to be formed in the respective active regions in the semiconductor layers 112A, 112B. Furthermore, it should be appreciated that, in the embodiment illustrated in FIG. 1*i*, the trench isolation structures 125A, 125B may be formed prior to depositing sophisticated high-k dielectric materials and/or metal-containing gate electrode materials, while, in other illustrative embodiments, such materials may have been formed and patterned prior to actually applying a process sequence for forming the trench isolation structures 125A, 125B. It should also be appreciated that, in the manufacturing stage shown, the semiconductor layers 112A, 112B may be shown so as to have an exposed semiconductor surface, while, in other stages, any appropriate protective layer, such as an oxide material and the like, may still cover the semiconductor layers 112A, 112B.

The trench isolation structures 125A, 125B may be formed on the basis of established process techniques involving lithography, patterning, deposition, planarization processes and the like in order to form respective trenches extending to a desired depth, i.e., at least extending to the buried insulating layer 111, fill the trenches with an appropriate dielectric material, such as oxide, nitride and the like, and remove any excess material thereof, for instance, by chemical mechanical polishing (CMP), which may also include the removal of any mask layers, such as oxide, nitride and the like, in order to finally expose the semiconductor layers 112A and/or 112B.

As discussed above, prior to or after forming the trench isolation structures 125A, 125B, a corresponding process sequence may be applied so as to form sophisticated gate electrode structures as part of transistors having a fully depleted channel region, as is also discussed above. To this end, appropriate processes may be applied, in which a gate dielectric base layer, such as an oxide layer, a nitride layer, an oxynitride layer and the like, is formed with an appropriate reduced thickness so as to provide appropriate surface conditions for the subsequent deposition and formation of advanced high-k dielectric layers, which may provide reduced leakage currents due to a moderately high physical thickness, while still maintaining a high capacitive coupling to the channel, thereby obtaining superior electrostatic control of the underlying channel. To this end, respective deposition techniques, such as physical vapor deposition (PVD), chemical vapor deposition (CVD), atomic layer deposition (ALD) and the like, may be applied in combination with patterning strategies, followed by appropriate anneal techniques in order to obtain a desired material composition of gate dielectric materials for respective types of transistors, such as P-channel transistors and N-channel transistors. Moreover, a metal-containing electrode material in combination with "conventional" electrode materials, such as amorphous silicon, polysilicon and the like, may be deposited, possibly in combination with appropriate mask materials, which may then be patterned into gate electrode structures having the dimensions required for devices of a gate length of 30 nm and less.

Figure 1J:
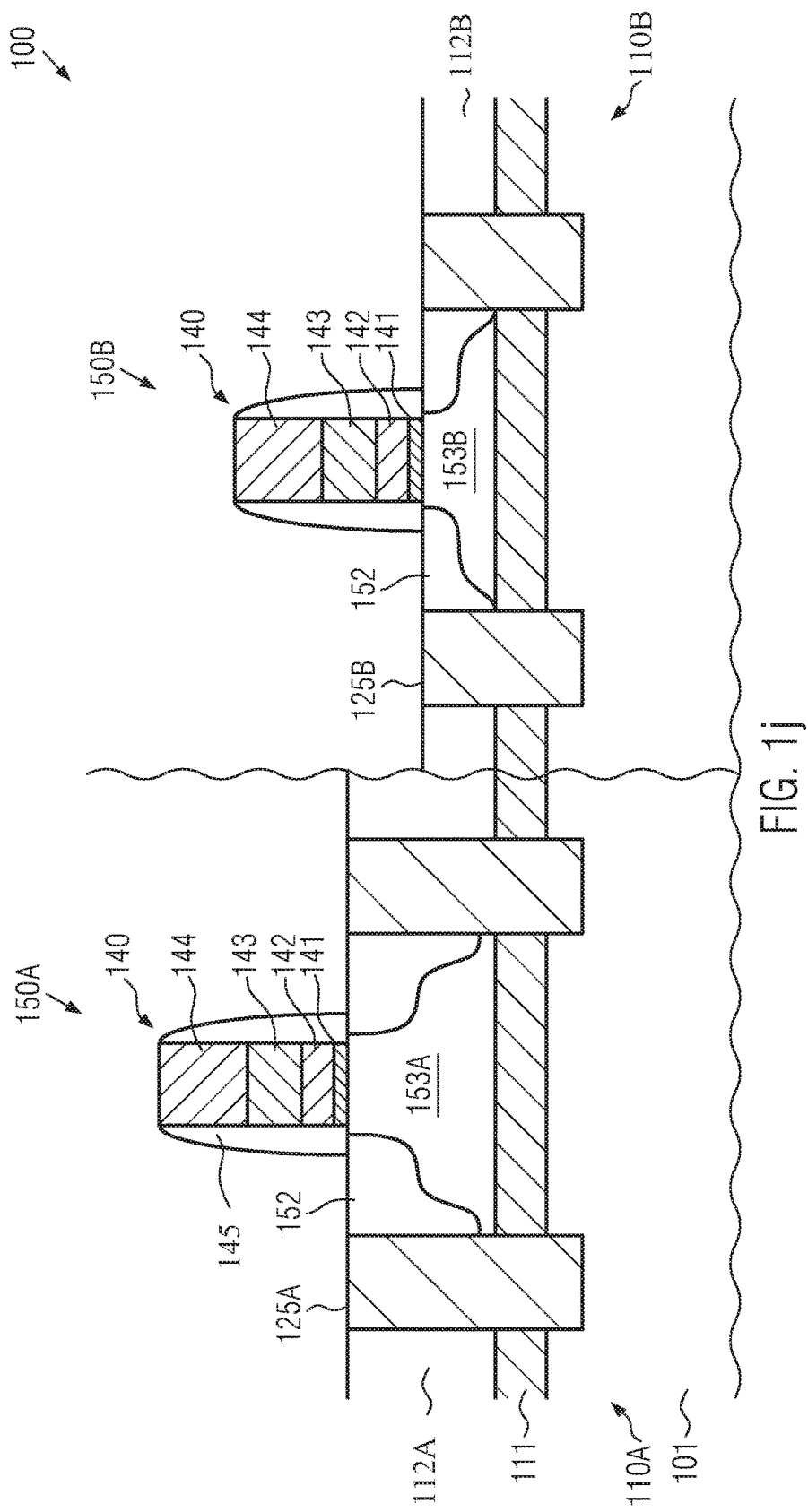

FIG. 1*j* schematically illustrates the semiconductor device 100 in a further advanced manufacturing stage. As illustrated, gate electrode structures 140 may be formed on the semiconductor layers 112A, 112B in accordance with process strategies, as discussed above. That is, the gate dielectric layer may be provided in the form of a base material 141 in combination with a sophisticated high-k dielectric material 142, which in turn may composed of two or more different material layers and materials in order to obtain the desired dielectric characteristics. For example, materials on the basis of hafnium may frequently be used as a high-k dielectric material, however, many other materials and compositions are well established in the art and may be used. An appropriate metal-containing conductive material 143, which may include aluminum, lanthanum and the like, may be provided so as to adjust, in combination with the underlying dielectric materials, the overall electronic characteristics, such as work function and the like, thereby also determining a basic threshold voltage of a transistor element 150A. Moreover, a further electrode material 144, possibly in combination with a cap material (not shown), may be provided, and a spacer structure 145 may provide the lateral encapsulation of the sensitive materials and may also serve as a mask for profiling drain and source regions 152, for instance on the basis of ion implantation, selective deposition of doped semiconductor materials and the like. A channel region 153A, which may represent a substantially undoped semiconductor material, previously formed on the basis of selective epitaxial growth, may be formed between the drain and source regions 152, wherein, due to the vertical confinement by the layer 111 and the adapted thickness 115A, designed for elevated operating voltages and reduced hot carrier injection (see FIG. 1*g*), a fully depleted transistor configuration may be achieved.

A transistor 150B formed in and above the second device region 110B may have basically a similar gate electrode structure 140 in combination with drain and source regions 152, which are separated by a channel region 153B, which is formed on the basis of the semiconductor layer 112B having a target thickness 115B (see, for instance, FIG. 1c), which is generally significantly less compared to the thickness of the channel region 153A in order that a fully depleted device configuration may be obtained for high performance transistors requiring an operation at an operating voltage that is significantly less compared to the transistor 150A.

The transistors 150A, 150B may be formed on the basis of well-established process strategies, such as forming the drain and source regions 152 during and/or after forming the gate electrode structures 140 by well-established implantation techniques and/or by material deposition and the like. It should be appreciated that, in other illustrative embodiments (not shown), a raised drain and source architecture may be applied, wherein an upper surface of the drain and source regions 152 may be positioned well above the interface between the channel regions 153A, 153B and the respective gate electrode structures 140, i.e., the gate dielectric materials 141. To this end, well-established epitaxial growth techniques may be applied.

Thereafter, the processing may be continued by depositing an interlayer dielectric material so as to confine the transistors 150A, 150B and subsequently forming respective contact openings to the drain and source regions 152 and the gate electrode structures 140, where required. In other process strategies, the gate electrode structures 140 may represent placeholder gate structures, which may be replaced, at least partially, by the actual respective gate materials in a very late manufacturing stage, for example, after the deposition of interlayer dielectric materials. To this end, the surface of the placeholder gate electrode structures may be exposed and a material removal process may be applied so as to form corresponding gate openings, in which appropriate gate materials may be deposited or may be formed by oxidation, if a respective gate opening is formed so as to extend to and possibly into the underlying semiconductor materials 112A and/or 112B. It should also be appreciated that some of the gate electrode structures 140 may be formed in an early manufacturing stage, for instance as shown in FIG. 1j, while other gate electrode structures may be formed in a late manufacturing stage, as discussed before.

Figure 1K:
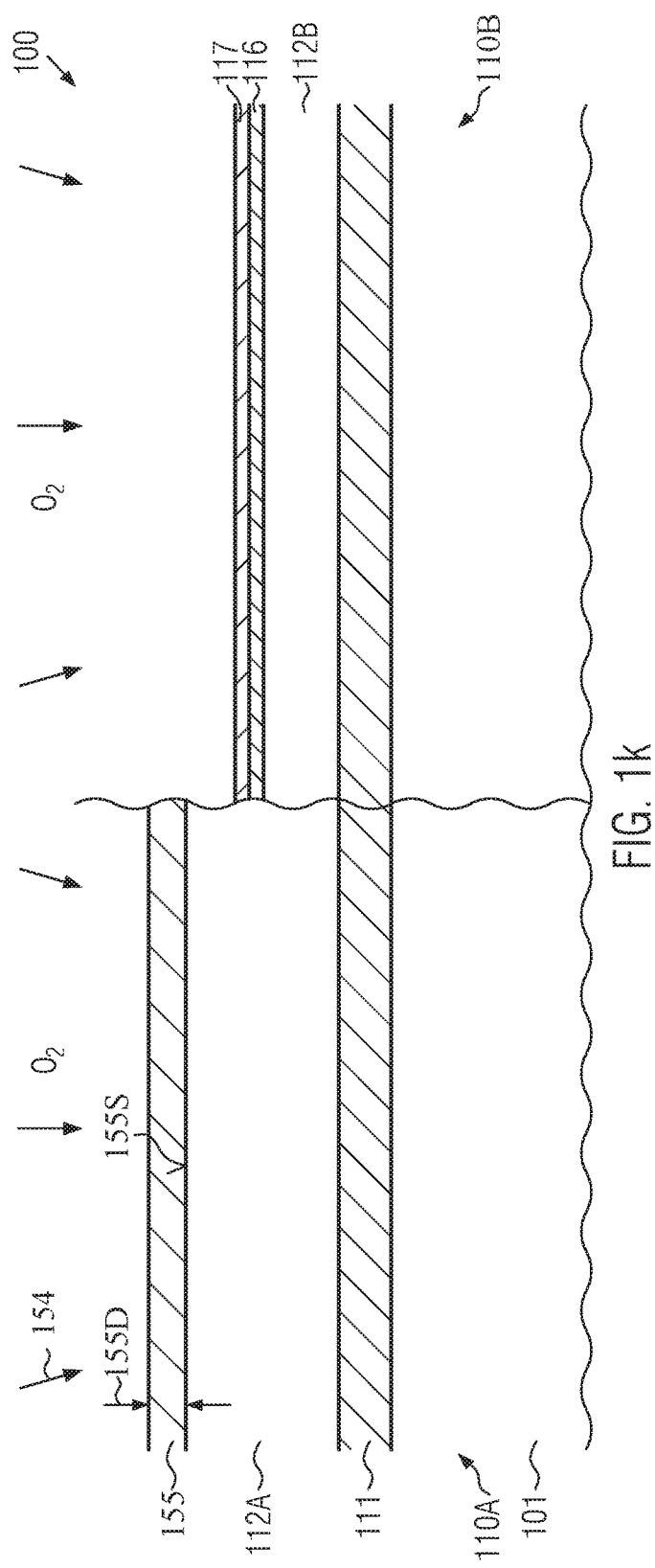
FIG. 1k schematically illustrates a cross-sectional view of the semiconductor device of the preceding figures, wherein, according to one illustrative embodiment, a portion of a gate dielectric material may be formed in an early manufacturing stage.

FIG. 1k schematically illustrates the device 100 according to illustrative embodiments in an early manufacturing stage, i.e., after the epitaxial growth of the semiconductor material 112A having an increased thickness so as to reduce the overall electric field strength in transistors, as discussed above. In the manufacturing stage shown, the semiconductor material 112A has been formed by growth techniques, as discussed above, while the second semiconductor layer 112B may be covered by the oxide layer 116 and the hard mask layer 117, such as a silicon nitride material, as also discussed above. After the formation of the semiconductor layer 112A, the device may be exposed to an oxidizing ambient 154 in order to form a high quality oxide layer 155, which may thus have superior quality and characteristics at an interface 155S formed between the semiconductor material 112A and the oxide layer 155. During the process 154, process parameters may be selected so as to obtain a desired thickness 155D that meets the requirements for a base gate dielectric material for gate electrode structures to be formed on the semiconductor material 112A. To this end, the desired thickness 155D may be adjusted, while also taking into consideration the material consumption of the layer 112A when initially forming the layer 112A by epitaxial growth techniques. On the other hand, the semiconductor layer 112B is reliably protected by the hard mask layer 117 without requiring any additional masking steps for providing the base dielectric material 155. Consequently, a highly efficient overall process sequence may be achieved, wherein advantageously any thermal budget considerations for forming the base gate dielectric material 155 are not relevant, since any temperature sensitive processes, such as ion implantation and patterning steps, will be performed after the growth of the base dielectric material 155.

After having formed the dielectric material 155 having the superior characteristics at the interface 155S, the further processing may be continued, as, for instance, already discussed above with reference to FIG. 1h. It should be appreciated that the formation of the oxide layer 155 prior to actually forming the trench isolation structures 125A, 125B may require minor adaptations of the process of forming an oxide liner in the isolation trenches. That is, upon forming oxide liners in the trenches of the trench isolation structures, the previously high-quality oxide material, i.e., its thickness, may be taken into consideration so as to not unduly affect the electric behavior, in particular at the edge between the active region and the trench isolation structure. That is, a difference in shape and structure of a dielectric material at the corner of the trench isolation structures 125A (FIG. 1j) caused by the growth of the high-quality oxide 155 may be readily addressed during the subsequent formation of the isolation structures 125A and 125B by adapting the deposition and/or growth of an oxide liner in the non-filled trenches.

Moreover, it should be noted that a possible degradation of the high-quality oxide layer 155 caused by implantation through the oxide layer 155 may be readily addressed by any subsequent anneal processes so as to substantially heal any implantation-induced damage. For example, as discussed above, during the process of forming the sophisticated high-k gate structures 140, one or more anneal processes are typically required so as to adjust the material characteristics of the gate electrode structures 140, thereby also efficiently restoring the structure of the high-quality oxide layer 155.

With reference to FIGS. 2a-2e, further illustrative embodiments will now be described, wherein a semiconductor material of increased thickness may be formed prior to forming and/or preparing a semiconductor material for transistor structures requiring an extremely thin channel region. It should be appreciated that, in the following description, like or similar components already discussed with reference to FIGS. 1a-1k may be designated by the same reference signs except for the leading digit, which is a 2 instead of a 1.

Figure 2A:
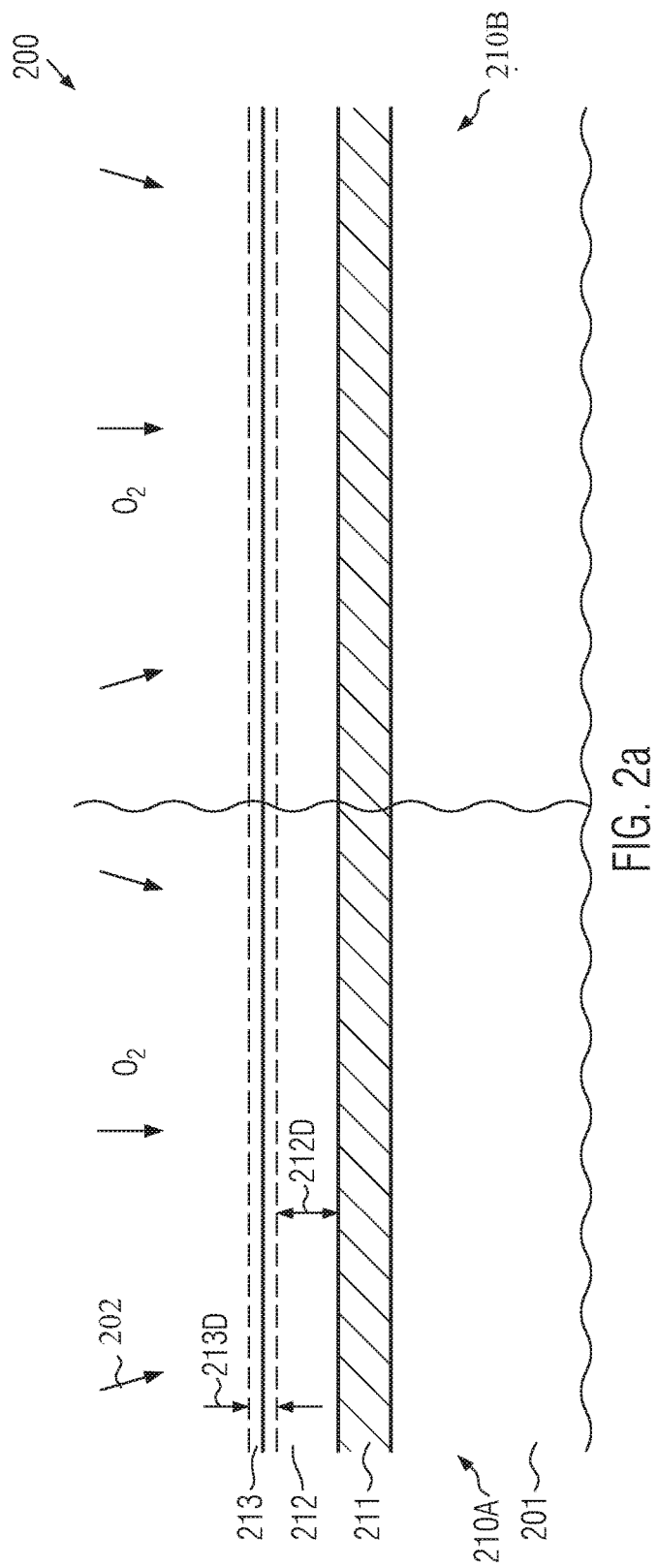

FIG. 2a schematically illustrates a cross-sectional view of a semiconductor device 200 having at least a first device region 210A and a second device region 210B. A substrate 201, such as a silicon substrate or any other appropriate carrier material, comprises a buried insulating layer 211 followed by an initial semiconductor layer 212. With respect to these components, the same criteria apply as previously explained in the context of FIGS. 1a-1k. In this manufacturing stage, the substrate 201 is exposed to an oxidizing ambient 202, during which an oxide layer 213 may be formed in and above the semiconductor layer 212. During the process 202, a certain degree of material consumption may result in a reduced thickness 212D of the layer 212, while also in correlation to the material consumption in semiconductor layer 212, an oxide layer 213 is grown so as to exhibit a specific thickness 213D. In this embodiment, the thickness 213D of the layer 213 is adjusted such that at least any further material consumption is taken into consideration, which may occur upon using the oxide layer 213 as a growth mask above the second device region 210B when forming additional semiconductor material in the first device region 210A. To this end, the expected material consumption in any of the subsequent process steps may readily be determined by experiment and the like, thereby ensuring that the initial thickness 213D is sufficient to accommodate the material consumption and also preserve sufficient material for acting as a growth mask.

Figure 2B:
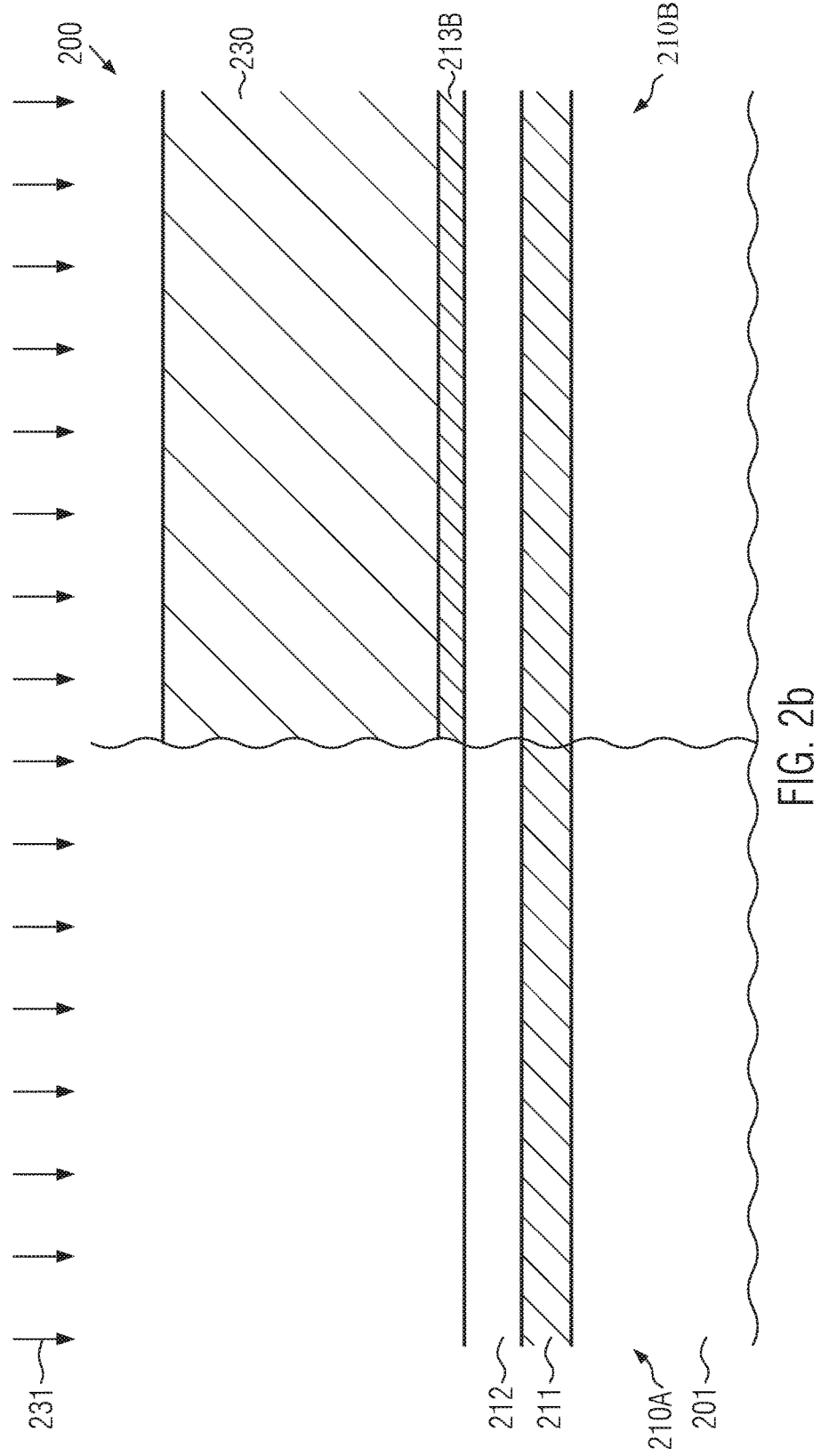

FIG. 2b schematically illustrates the semiconductor device 200 during a patterning process 231, in which, based on an appropriate mask 230, the layer 213 is removed from above the semiconductor layer 212 in the first device region 210A, thereby forming a growth mask 213B for the second device region 210B. Respective process techniques based on lithography and etch techniques are well established in the art.

Figure 2C:
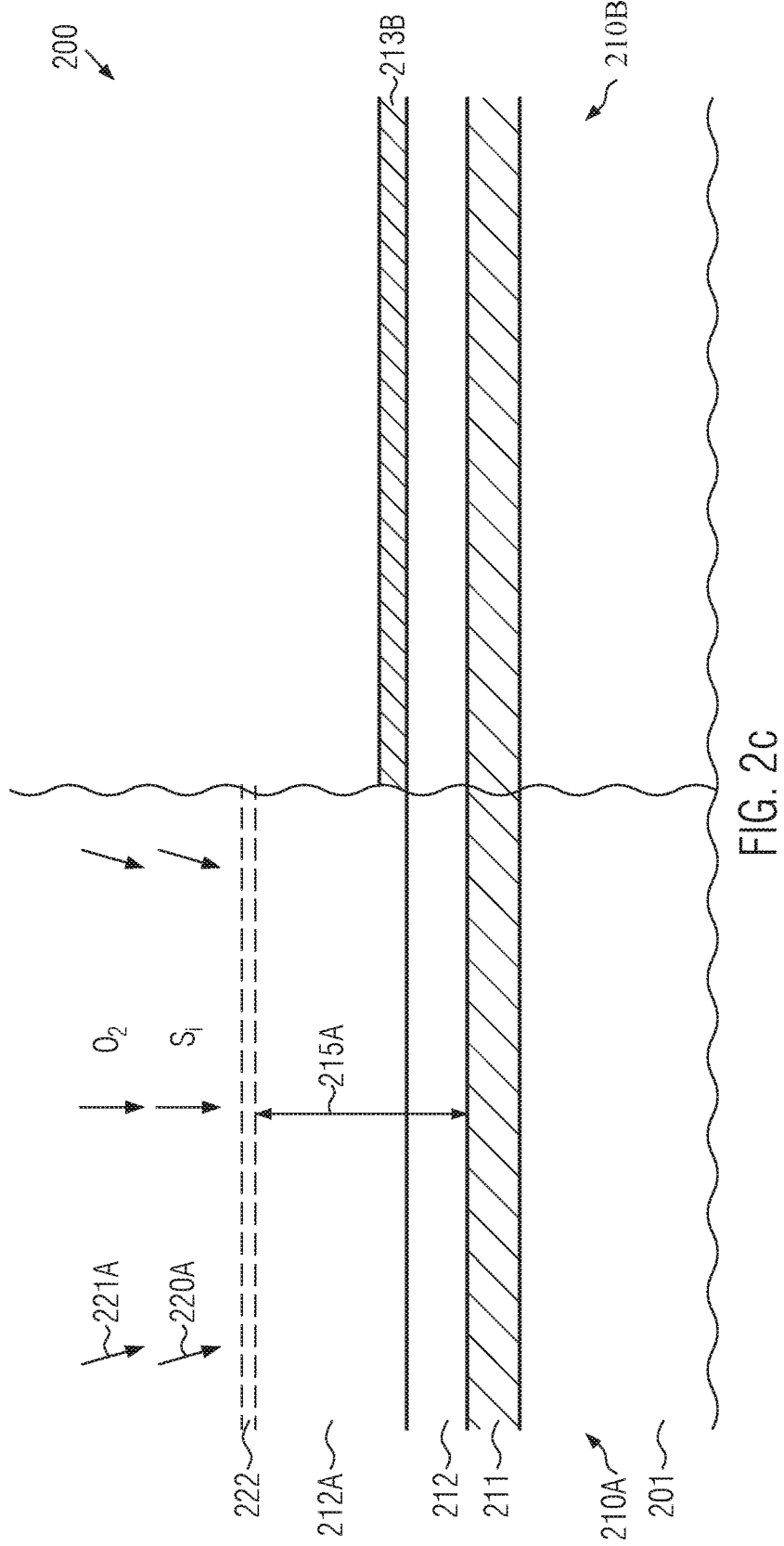

FIG. 2c schematically illustrates the device 200 in a further advanced stage, in which a selective epitaxial growth process 220A may be performed on the exposed portion of the semiconductor layer 212. As discussed above, during the respective process sequence, the layer 213B may act as a growth mask, wherein a respective material consumption of the layer 213B, for instance by respective cleaning processes and the like for preparing the exposed surface of the layer 212, are taken into consideration so as to maintain a required thickness of the layer 213B for the following growth process 220A. After the growth process 220A, a further process, such as an oxidation process 221A, may be performed in order to obtain a protective layer 222 above the semiconductor layer 212A having a desired thickness 215A in accordance with requirements for transistors that are to be operated at elevated operating voltages, as discussed above. The process 221A may comprise a wet chemical cleaning process, during which a native oxide is formed, thereby providing the layer 222, while in other cases, additionally or alternatively, a thermally grown oxide layer may be formed or an oxidizing ambient on the basis of oxygen radicals may be applied. Also in this case, a potential material consumption of the previously grown semiconductor layer 212A may be taken into consideration so as to precisely adjust the desired target thickness 215A, for example in the range of 8-15 nm.

Figure 2D:
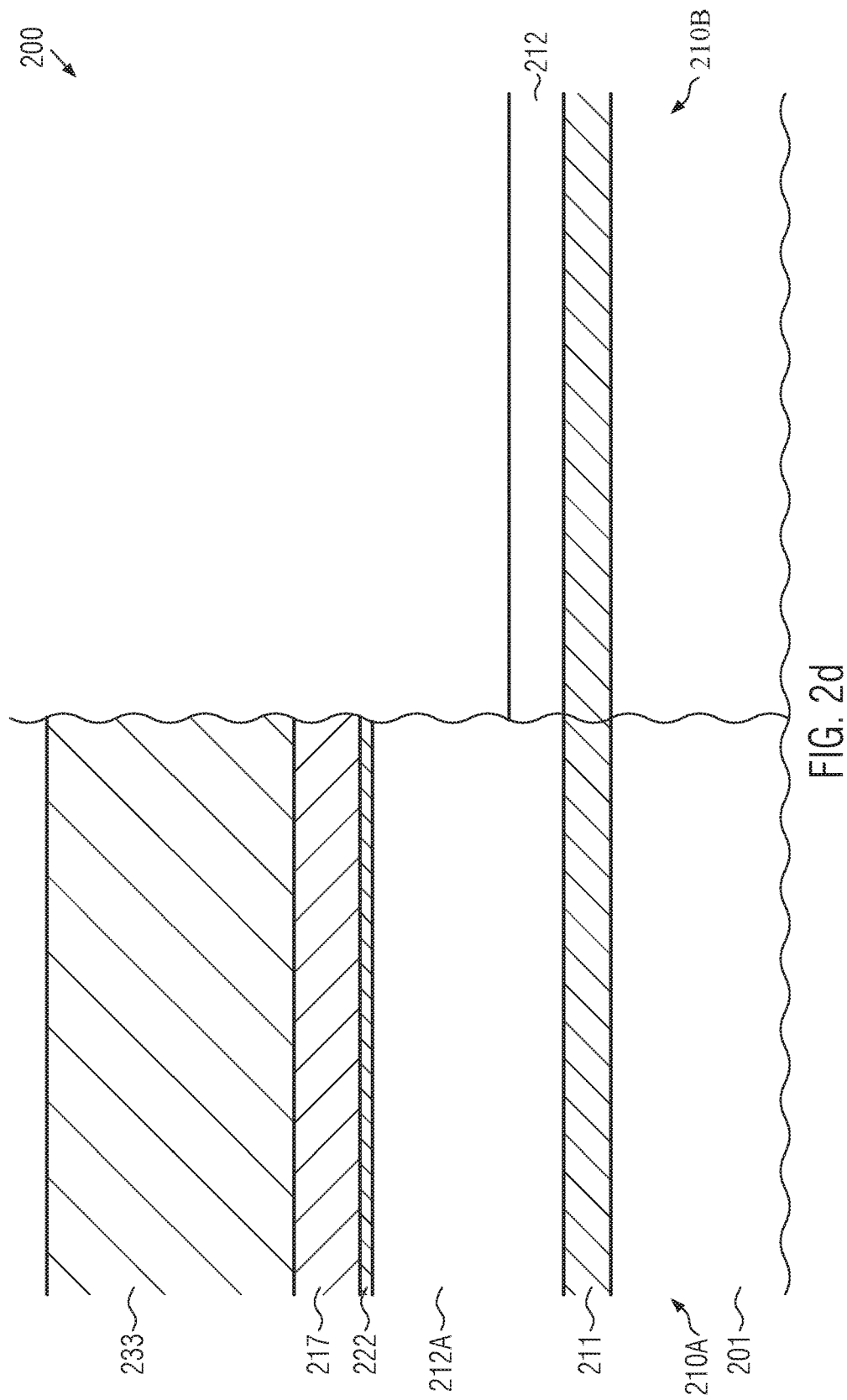

FIG. 2d schematically illustrates the device 200 according to illustrative embodiments wherein a hard mask layer 217 may be formed above the semiconductor material 212A including the protective layer 222. The material layer 217 may be provided in the form of a silicon nitride material with an appropriate thickness so as to act as a growth mask during a subsequent epitaxial growth process. The layer 217 may be patterned on the basis of an appropriate mask 233 formed by lithography, followed by appropriate selective etch recipes, which may remove the exposed portion of the layer 217 and the layer 213B (see FIG. 2c) thereby finally exposing the surface of the initial semiconductor layer 212. Thereafter, the mask 233 may be removed and respective processes for cleaning and preparing the surface of the layer 212 for a subsequent epitaxial growth process may be performed. Thereafter, the semiconductor layer 212 may be modified, for instance partially removed, and replaced by a different material and the like, as is also previously discussed with respect to the device 100, for example, with reference to FIGS. 1B and 1C. Thereafter, the further processing may be continued by forming isolation structures, gate electrode structures and finally transistor elements in accordance with the overall design and device requirements.

FIG. 2e schematically illustrates the semiconductor device 200 in a further advanced manufacturing stage in which transistor elements 250A (only one is shown in FIG. 2e) are formed in and above the first device region 210A, while transistor elements 250B (only one as shown in FIG. 2e) are formed in and above the second device region 210B. The transistors 250A, 250B may comprise respective sophisticated gate electrode structures 240 formed above respective channel regions 253A, 253B. With respect to these components, the same criteria apply as previously discussed with reference to the device 100. In particular, the various options for forming the gate electrode structures and respective trench isolation structures may also apply for the device 200. Consequently, providing the semiconductor material 212A with increased thickness for forming the channel region 253A prior to forming and/or modifying the semiconductor material 212 for the channel region 253B results in reduced process complexity.

As a result, the present disclosure provides manufacturing techniques in which the problem of significant hot carrier injection in transistors requiring an operation at elevated operating voltages may be reduced by selectively increasing the thickness of the base semiconductor material, thereby forming channel regions of increased thickness, while still maintaining a fully depleted device configuration. The selective increase of thickness is accomplished by epitaxial growth techniques, thereby offering precise process control and thus reduced process variability compared to other techniques. Moreover, the formation of a semiconductor material of increased thickness may substantially not negatively affect the "thin" semiconductor material, which may be independently formed and/or modified in accordance with the overall device requirements. In some illustrative embodiments, a base dielectric material for gate electrode structures to be formed on the "thick" semiconductor layer may be formed in an early manufacturing stage, i.e., prior to the formation of trench isolation structures, without being restricted by the thermal budget of subsequent processes, such as implantation processes and the like. In this manner, superior interface qualities may be achieved, thereby resulting in reduced gate leakage, reduced noise properties and the like. Moreover, the techniques disclosed herein are designed such that typically well-established process steps and tools may be used. As a consequence, fully depleted SOI transistors may be formed, wherein hot carrier injection reliability may be specifically designed for different transistor types, for instance, for transistors requiring a moderately high operating voltage versus transistors requiring a moderately low operating voltage and the like. The thickness of a semiconductor material and hence the thickness of a corresponding channel region for high performance transistors may be selected within a range of 8 nm or less, while the thickness of the semiconductor material and thus the thickness of channel regions of other transistors may be selected to be in a range of, for example, 8-15 nm. It should be appreciated that the concepts disclosed herein may be readily applied to more than two different transistor types. Moreover, the teaching of the present disclosure is compatible with various process strategies for forming sophisticated planar transistors. For example, gate electrode structures may be formed in an early manufacturing stage or may be finalized based on placeholder gate electrode structures in a very advanced stage. Similarly, the present disclosure is not restricted to any specific concepts in forming drain and source regions, nor is there any restriction with respect to implementing further advanced concepts, such as strain engineering and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming semiconductor devices, the method comprising:
    epitaxially growing a portion of a first semiconductor layer above a buried insulating layer in a first device region, said first semiconductor layer having a first thickness after said epitaxial growth process is performed;
    forming a second semiconductor layer of a second thickness above said buried insulating layer in a second device region, said second thickness differing from said first thickness, wherein forming said second semiconductor layer comprises, prior to epitaxially growing said portion of said first semiconductor layer, epitaxially growing a portion of said second semiconductor layer so as to obtain said second thickness, forming a growth mask above said second semiconductor layer, and selectively epitaxially growing said portion of said first semiconductor layer by using said growth mask;
    forming a first transistor element in and on said first semiconductor layer; and
    forming a second transistor element in and on said second semiconductor layer, said second transistor element comprising a fully depleted channel region.

2. The method of claim 1, wherein forming said growth mask comprises oxidizing a semiconductor material in said first and second device regions so as to adjust an initial layer thickness of said first and second semiconductor layers and removing an oxidized portion above said first device region.

3. The method of claim 2, further comprising forming a hardmask that covers said first device region but exposes said second device region and processing said second semiconductor layer so as to obtain said second thickness.

4. The method of claim 1, wherein epitaxially growing a portion of said second semiconductor layer comprises growing a compound semiconductor material.

5. The method of claim 4, wherein said compound semiconductor material comprises germanium.

6. The method of claim 1, further comprising forming a cap layer on said second semiconductor layer.

7. The method of claim 6, wherein forming said cap layer comprises adjusting a ratio of atomic species in said second semiconductor layer by performing a heat treatment in an oxidizing ambient.

8. The method of claim 1, further comprising thermally growing an oxide layer on said first semiconductor layer having a thickness required for forming a gate electrode structure of said first transistor element.

9. A method of forming semiconductor devices, said method comprising:
    providing an initial semiconductor layer above a first device region and a second device region, said initial semiconductor layer being formed above a buried insulating layer;
    performing a first epitaxial growth process selectively in said first device region so as to form a first semiconductor layer by using at least a first portion of said initial semiconductor layer as a growth template;
    prior to said first epitaxial growth process, performing a second epitaxial growth process in said second device region so as to form a second semiconductor layer by using at least a second portion of said initial semiconductor layer as a growth template, forming a hardmask layer above said second device region after said second epitaxial growth process and prior to performing said first epitaxial growth process;
    forming a first transistor element in and on said first semiconductor layer; and
    forming a second transistor element in and on said second semiconductor layer, said second transistor element comprising a fully depleted channel region.

10. The method of claim 9, further comprising forming a protective oxide layer on said first semiconductor layer.

11. The method of claim 9, further comprising thermally growing an oxide layer on said first semiconductor layer while using said hardmask layer as a growth mask, said oxide layer having a thickness required for forming a gate electrode structure of said first transistor element.

12. A method of forming semiconductor devices, the method comprising:
    epitaxially growing a portion of a first semiconductor layer above a buried insulating layer in a first device region, said first semiconductor layer having a first thickness after said epitaxial growth process is performed;
    forming a second semiconductor layer of a second thickness above said buried insulating layer in a second device region, said second thickness differing from said first thickness, wherein forming said second semiconductor layer comprises epitaxially growing a portion of said second semiconductor layer so as to obtain said second thickness, forming a cap layer on said second semiconductor layer by adjusting a ratio of atomic species in said second semiconductor layer by performing a heat treatment in an oxidizing ambient;
    forming a first transistor element in and on said first semiconductor layer; and
    forming a second transistor element in and on said second semiconductor layer, said second transistor element comprising a fully depleted channel region.

13. The method of claim 12, further comprising, prior to epitaxially growing said portion of said first semiconductor layer, forming a mask layer that covers said second device region but exposes said first device region and epitaxially growing said portion of said first semiconductor layer by using said mask layer as a growth mask.

14. The method of claim 13, wherein forming said mask layer comprises oxidizing a semiconductor material in said first and second device regions so as to adjust an initial layer thickness of said first and second semiconductor layers and removing an oxidized portion above said first device region.

15. The method of claim 12, further comprising forming a hardmask that covers said first device region but exposes said second device region and processing said second semiconductor layer so as to obtain said second thickness.

16. The method of claim 12, wherein epitaxially growing a portion of said second semiconductor layer comprises growing a compound semiconductor material.

17. The method of claim 16, wherein said compound semiconductor material comprises germanium.

18. The method of claim 12, further comprising thermally growing an oxide layer on said first semiconductor layer having a thickness required for forming a gate electrode structure of said first transistor element.

* * * * *